(12) United States Patent
Ali

(10) Patent No.: US 8,723,707 B2
(45) Date of Patent: May 13, 2014

(54) CORRELATION-BASED BACKGROUND CALIBRATION FOR REDUCING INTER-STAGE GAIN ERROR AND NON-LINEARITY IN PIPELINED ANALOG-TO-DIGITAL CONVERTERS

(75) Inventor: Ahmed Mohamed Abdelatty Ali, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/560,226

(22) Filed: Jul. 27, 2012

(65) Prior Publication Data

US 2013/0120174 A1    May 16, 2013

Related U.S. Application Data

(60) Provisional application No. 61/559,388, filed on Nov. 14, 2011.

(51) Int. Cl.
*H03M 1/10* (2006.01)

(52) U.S. Cl.
USPC ............ 341/120; 341/118; 341/161; 341/162

(58) Field of Classification Search
USPC .................................. 341/118, 120, 161, 162
See application file for complete search history.

(56) References Cited

U.S. PATENT DOCUMENTS

| | | | |
|---|---|---|---|
| 4,751,496 A | 6/1988 | Araki et al. | |
| 5,990,815 A | 11/1999 | Linder et al. | |
| 6,172,629 B1 | 1/2001 | Fetterman | |
| 6,268,814 B1 | 7/2001 | Kolsrud | |
| 6,369,744 B1 | 4/2002 | Chuang | |
| 6,373,424 B1 | 4/2002 | Soenen | |
| 6,404,364 B1 | 6/2002 | Fetterman et al. | |
| 6,441,769 B1 | 8/2002 | Nagaraj | |
| 6,456,223 B1 | 9/2002 | Yu et al. | |
| 6,462,685 B1 | 10/2002 | Korkala | |
| 6,501,400 B2 | 12/2002 | Ali | |
| 6,624,772 B1 | 9/2003 | Gealow et al. | |
| 6,686,864 B1 | 2/2004 | Moreland | |
| 6,734,818 B2 | 5/2004 | Galton | |
| 6,784,814 B1 | 8/2004 | Nair et al. | |

(Continued)

FOREIGN PATENT DOCUMENTS

| | | |
|---|---|---|
| EP | 0 536 504 B1 | 11/1997 |
| EP | 1182781 A2 | 2/2002 |
| WO | 2010/019202 A1 | 2/2010 |

OTHER PUBLICATIONS

PCT International Search Report from PCT/US2012/054740 mailed on Nov. 20, 2012.

(Continued)

*Primary Examiner* — Khai M Nguyen
(74) *Attorney, Agent, or Firm* — Kenyon & Kenyon, LLP

(57) ABSTRACT

A method and a corresponding device for calibrating a pipelined analog-to-digital converter (ADC) involve injecting a randomly determined amount of dither into one of a flash component and a multiplying digital-to-analog converter (MDAC) in at least one stage in the ADC. For each stage of the at least one stage a correlation procedure is performed to estimate, based on an output of the ADC, an amount of gain experienced by the injected dither after propagating through the stage. The stage is then calibrated based on its respective gain estimate.

32 Claims, 8 Drawing Sheets

(56) References Cited

U.S. PATENT DOCUMENTS

| | | | |
|---|---|---|---|
| 6,822,601 B1 | 11/2004 | Liu et al. | |
| 6,839,009 B1 | 1/2005 | Ali | |
| 6,894,631 B1 | 5/2005 | Bardsley | |
| 6,950,048 B1 | 9/2005 | Slavin | |
| 6,970,120 B1 | 11/2005 | Bjornsen | |
| 7,002,504 B2 | 2/2006 | McMahill | |
| 7,006,028 B2 | 2/2006 | Galton | |
| 7,015,851 B1 | 3/2006 | Bruhns et al. | |
| 7,034,736 B1 | 4/2006 | Ali | |
| 7,035,756 B2 | 4/2006 | Maloberti et al. | |
| 7,107,175 B2 | 9/2006 | Maloberti et al. | |
| 7,187,310 B2 | 3/2007 | El-Sankary et al. | |
| 7,221,299 B2 * | 5/2007 | Bjornsen | 341/131 |
| 7,233,276 B1 | 6/2007 | Huang | |
| 7,268,720 B1 * | 9/2007 | Murden | 341/161 |
| 7,271,750 B1 | 9/2007 | Ali et al. | |
| 7,283,074 B2 | 10/2007 | Sheng et al. | |
| 7,405,681 B2 | 7/2008 | Jonsson et al. | |
| 7,535,391 B1 | 5/2009 | Newman et al. | |
| 7,535,399 B2 | 5/2009 | Abugharbieh et al. | |
| 7,548,178 B2 | 6/2009 | Delano | |
| 7,595,748 B2 * | 9/2009 | Tu | 341/118 |
| 7,602,323 B2 | 10/2009 | Galton et al. | |
| 7,602,324 B1 | 10/2009 | Huang et al. | |
| 7,612,703 B2 | 11/2009 | Chen et al. | |
| 7,719,452 B2 * | 5/2010 | Bardsley et al. | 341/131 |
| 7,786,910 B2 | 8/2010 | Ali et al. | |
| 7,898,452 B2 | 3/2011 | Lewis et al. | |
| 8,068,045 B2 * | 11/2011 | Ali et al. | 341/131 |
| 2004/0051657 A1 | 3/2004 | Jonsson et al. | |
| 2006/0227052 A1 | 10/2006 | Tavassoli Hozouri | |
| 2008/0258949 A1 | 10/2008 | Galton et al. | |
| 2009/0102688 A1 | 4/2009 | Cesura et al. | |
| 2011/0043395 A1 * | 2/2011 | Sun et al. | 341/120 |
| 2011/0285564 A1 * | 11/2011 | Erdmann | 341/120 |

OTHER PUBLICATIONS

Keane et al., "Background interstage gain calibration technique for pipelined ADCs", IEEE Transactions on Circuits and Systems I: Regular Papers, vol. 52, Issue 1. Jan. 2005. pp. 1-32.

Lewis, et al., "A 10-b 20 Msample/s Analog-to-Digital Converter", IEEE Journal of Solid-State Circuits, vol. 27, No. 3, Mar. 1992, pp. 351-358.

Pan et al., "A 3.3-V 12-b 50 MS/s A/D converter in 0.6um CMOS with 80-dB SFDR", IEEE Journal of Solid-State Circuits, vol. 35, No. 12, Dec. 2000, pp. 1769-1780.

Siragusa et al., "Gain Error Correction Technique for Pipelined Analogue-to-Digital Converters", Electronics Letters, vol. 36, No. 7, Mar. 30, 2000, pp. 617-618.

Nagaraj, "Area-Efficient Self-Calibration Technique for Pipe-lined Alcorithmic A/D Converters", IEEE Transactions on Circuits and Systems-II: Analog and Digital Signal Processing, vol. 43, No. 7, Jul. 1996, pp. 540-544.

Ming et al., "An 8b 80Msample/s Pipelined ADC with Background Calibration", IEEE International Solid-State Circuits Conference, 2000, pp. 42-43.

Lee, "A 12-b 600 ks/s Digitally Self-Calibrated Pipelined Algorithmic ADC", IEEE Journal Solid-State Circuits, vol. 29, Apr. 4, 1994, pp. 509-515.

Ali et al., "Correction of Operational Amplifier Gain Error in Pipelined A/D Converters", Proc. IEEE International Symposium on Circuits and Systems, ISCAS, 2001, pp. 568-571.

Ali et al., "Background Calibration of Operational Amplifier Gain Error in Pipelined A/D Converters", IEEE Transactions on Circuits and Systems II: Analog and Digital Signal Processing, vol. 50, No. 8, Sep. 2003, pp. 631-634.

Siragusa et al., "A Digitally Enhanced 1.8-V 15-bit 40 MSample/s CMOS Pipelined ADC", IEEE Journal Of Solid-State Circuits, vol. 39, No. 12, Dec. 2004, pp. 2126-2138.

Kester, "The Good, the Bad, and the Ugly Aspects of ADC Input Noise-Is No Noise Good Noise?," Tutorial MT-04, Analog Devices Inc., 2005, pp. 1-12.

Brannon, "Overcoming Converter Nonlinearities With Dither," AN-410 Application Note, Analog Devices Inc., 2005, pp. 1-8.

Shu et al., "A 15-Bit Linear 20-MS/s Pipelined ADC Digitally Calibrated with Signal-Dependent Dithering, " IEEE Journal of Solid State Circuits, vol. 43, No, 2, Feb. 1, 2008, pp. 342-350.

Farahani et al., "Low Power High Performance Digitally Assisted Pipelined ADC," IEEE Computer Society Annual Symposium on VLSI, Apr. 7, 2008, pp. 111-116.

* cited by examiner

CORRELATION-BASED BACKGROUND CALIBRATION FOR REDUCING INTER-STAGE GAIN ERROR AND NON-LINEARITY IN PIPELINED ANALOG-TO-DIGITAL CONVERTERS

CROSS-REFERENCE TO RELATED APPLICATIONS

This application claims the benefit, under 35 U.S.C. §119 (e), of U.S. Provisional Patent Application No. 61/559,388, filed Nov. 14, 2011, the content of which is hereby incorporated by reference in its entirety.

BACKGROUND INFORMATION

The performance of pipelined analog-to-digital converters (ADCs) is often limited by inter-stage gain errors and non-linearity. Gain errors can be caused by various factors, including mismatches in the capacitors in any particular stage and limitations in the gain producing capability of amplifiers inside the stage (amplifiers have finite gain). Gain error introduced in one stage tends to propagate through to subsequent stages in the pipeline, resulting in inter-stage gain error that can adversely affect the accuracy and linearity of the ADC output (i.e., the overall linearity of the ADC). Non-linearity of the amplifier can further degrade the overall linearity and refers to when the output of the amplifier is no longer a linear function of the input.

The background section of U.S. Pat. No. 7,786,910 ("the '910 patent," the content of which is hereby incorporated by reference in its entirety) describes various calibration techniques for gain error correction. In these and other conventional calibration techniques, a random or pseudo-random signal (referred to as dither) is injected in a component of a stage—in particular, injected into a multiplying digital-to-analog-converter (MDAC). The dither sees the same error as the main input signal and therefore the error in the dither detected in the output is indicative of the error experienced by the input signal. Since the dither is uncorrelated with the input signal, it can be separated digitally (by correlating it out) from the output. This is usually done with a digital correlator or using the least means square (LMS) algorithm. Further, by comparing the separated dither with its ideal value, it is possible to estimate the gain error that was encountered as the dither progressed from its point of injection through to the output of the ADC.

One disadvantage of the conventional calibration techniques is that the dither signal consumes a significant portion of the dynamic range of the DACs in each stage of the ADC that the dither propagates through. To overcome this disadvantage, the '910 patent proposes to use a relatively small (low amplitude) dither signal. An injection network with multiple parallel capacitive branches (formed using small capacitors) is used to generate the dither. When the dither is injected, fewer than all of the branches are used. This reduces the amplitude of the dither, thereby saving power and conserving dynamic range.

The technique proposed by the '910 patent, while suitable for many ADC applications, is limited by the resolution of the back-end of the ADC. This limitation is also shared by other conventional calibration techniques, in that they require the back-end pipeline to be as accurate as the calibration accuracy. Specifically, each stage in the back-end has a finite resolution, characterized by the number of bits that are available for processing the input. For example, if the output of the first stage is to be calibrated to 14-bit accuracy, then the back-end pipeline needs to be 14-bit accurate when processing the dither. The back-end is used to digitize the dither, which in turn is used to estimate the gain. Since the dither signal is smaller than the full-scale (FS) input signal, more bits are required in the back-end to achieve the same effective resolution. When processing an FS input, more bits are used and therefore the effective resolution is higher than when a small signal, such as the dither signal, is applied. For example, if the magnitude of the dither signal is ¼th the magnitude of the full scale signal, then for the dither signal to be digitized with a 14-bit accuracy, it will require a 16-bit back-end digitizer. If the accuracy of the back-end is not sufficient to handle the dither, there could be an error in estimating the dither error, which in turn results in an estimation error for the ADC output.

The traditional solution to this problem is to simply add more resolution, increasing the accuracy of the back-end. However, the additional hardware involved consumes extra power and incurs performance overhead. It is necessary to calibrate several stages (starting from the back-end) to ensure the overall accuracy of the ADC. Even then, the accuracy may still be inadequate because the dither may be too small compared to the input signal. This requires calibrating the back-end to an even higher accuracy. In some cases, it may not be possible to achieve the desired accuracy without adding additional stages to increase the overall pipeline accuracy.

SUMMARY

Example embodiments of the present invention provide for reducing inter-stage gain error and non-linearity in pipelined ADCs.

In one embodiment, dither is injected in one or the other of the MDAC and the flash (an ADC component) in at least one stage in the ADC. To prevent gain errors from propagating, it may be preferable that stages nearest to the input are calibrated using the method of the present invention before stages that are further from the input.

In another embodiment, the dither is a small (relative to the ADC input signal) multi-level digital signal that is randomly or pseudo-randomly generated. The number of levels may be an odd number. The dither amplitude may be a proper fraction of the ADC full-scale value, with an odd denominator.

In another embodiment, a large (again, relative to the input) multi-level dither is injected in the input to both the MDAC and flash, independently of the dither that is used for the calibration. The goal of injecting the additional dither is to reduce the effect of the non-linearity of the back-end stages on the dither signal used for calibration.

DETAILED DESCRIPTION OF EXAMPLE EMBODIMENTS

The present invention relates to systems and methods for reducing inter-stage gain error and non-linearity in pipelined ADCs.

Figure 1:
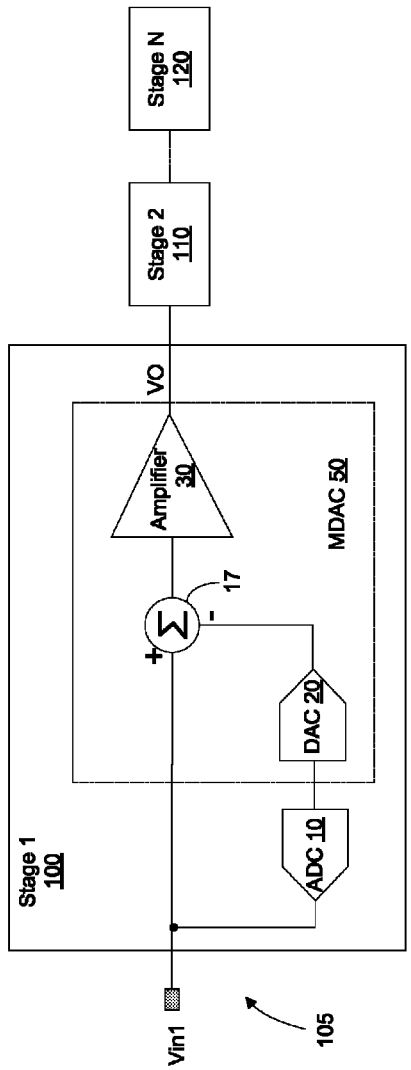
FIG. 1 shows a block diagram of a conventional pipelined ADC.

FIG. 1 shows a block diagram of a conventional pipelined ADC including a pipeline 105 that has a plurality of stages 100/110/120 connected in succession so that the output of one stage serves as the input of the next stage. For illustration purposes, only the first two stages and the final (Nth) stage are shown. However, any number of stages can be connected in this fashion. The first stage 100 is shown in detail and is connected to an analog input voltage Vin1 and includes an ADC 10 (also known as a "flash") and a multiplying digital-to-analog converter (MDAC) 50. The MDAC 50 includes a digital-to-analog converter (DAC) 20 and an amplifier 30. Vin1 is input to the ADC 10 to generate a digital input to the DAC 20, which in turn converts the digital output of the ADC 10 back into an analog signal. The analog output of the DAC 20 is then subtracted from Vin1 (17) to obtain a residue signal, which is then input to the amplifier 30 to generate an analog output voltage VO as input to the next stage, i.e., stage 110. The stages 100/110/120 may include similar components, with the analog output of one stage going into the input of the next stage. However, the final stage, i.e., stage 120, may not include a DAC or amplifier since the final output of the ADC is a digital signal that can be generated, for example, directly from the output of the ADC 10.

Figure 2:
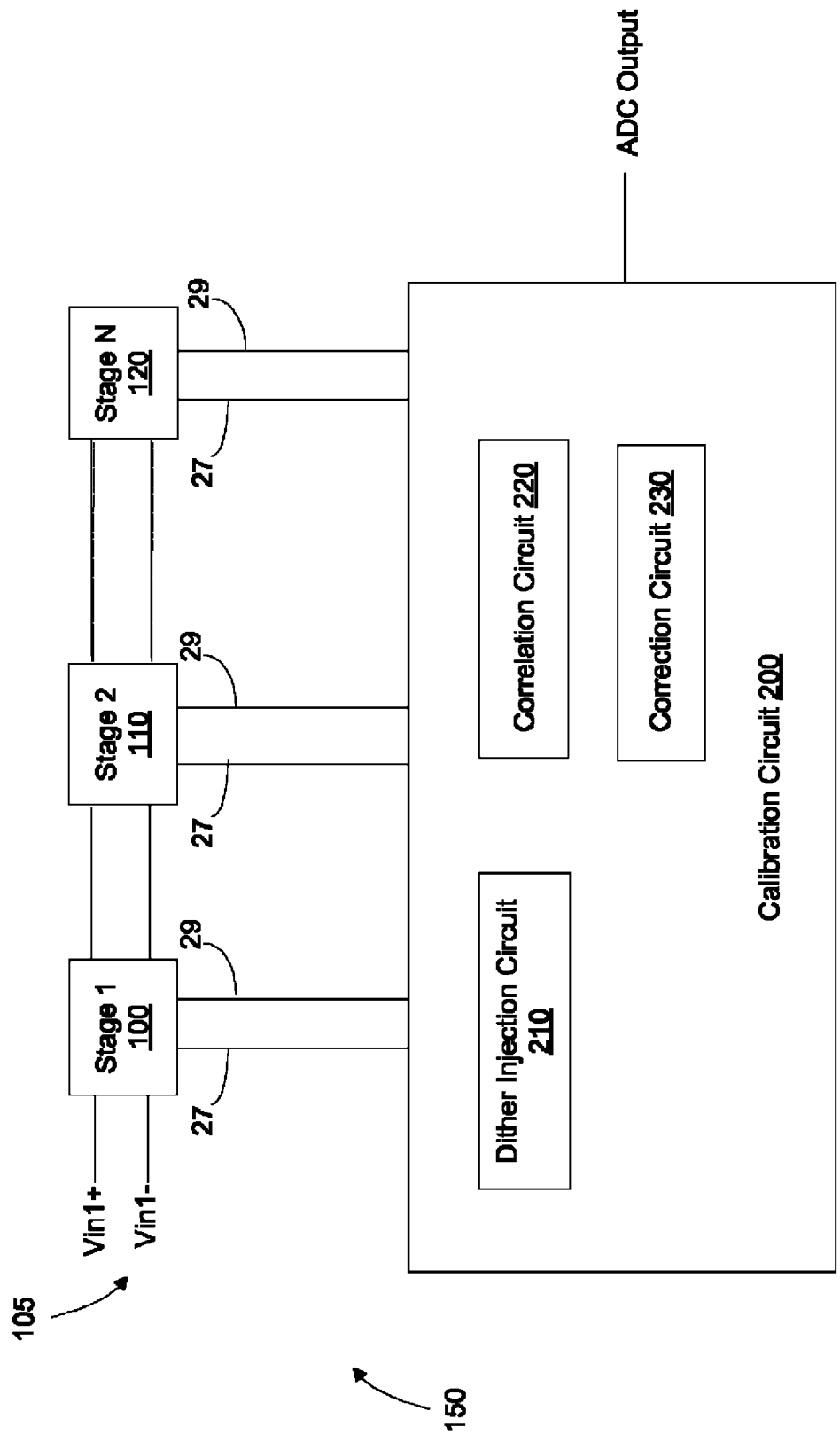
FIG. 2 shows an exemplary system for calibrating inter-stage gain error according to the present invention.

FIG. 2 shows an exemplary system 150 according to the present invention. The system 150 may include the pipeline 105 as described above, in addition to a calibration circuit 200. The calibration circuit 200 may include a dither injection circuit 210, a correlation circuit 220, and a correction circuit 230. The pipeline 105 is shown connected to a pair of differential inputs Vin1+ and Vin1−. It will be understood that the exemplary circuits and methods described herein may be used in conjunction with the hardware associated with either of these inputs.

The dither injection circuit 210 may include a circuit arrangement for generating and injecting dither into the MDAC or flash of at least one stage in the pipeline 105. In one embodiment, the calibration circuit 200 may inject dither into each stage and therefore may include connections 27 for injecting the dither as an analog or digital signal into a selected location in each of stages 100/110/120. However, it will be understood that dither need not be injected in all stages. Instead, it may be preferable from a performance perspective to inject dither in a few stages nearest the input, e.g., in the stage 100 and/or the stage 110.

The dither may be generated as a random or pseudo-random voltage within a predetermined voltage range (i.e., a set of discrete, equally spaced voltage levels, as will be explained), and applied to a suitable injection point in each stage, as explained below. Any method of generating and applying a select voltage may be used for providing the dither. For example, a pseudo-random digital number may be used for generating the dither voltage using a switched capacitor network in which the dither is injected via one or more capacitors connected in parallel with sampling capacitors in each stage (e.g., in sampling capacitors located in DAC 20).

Figure 3A:
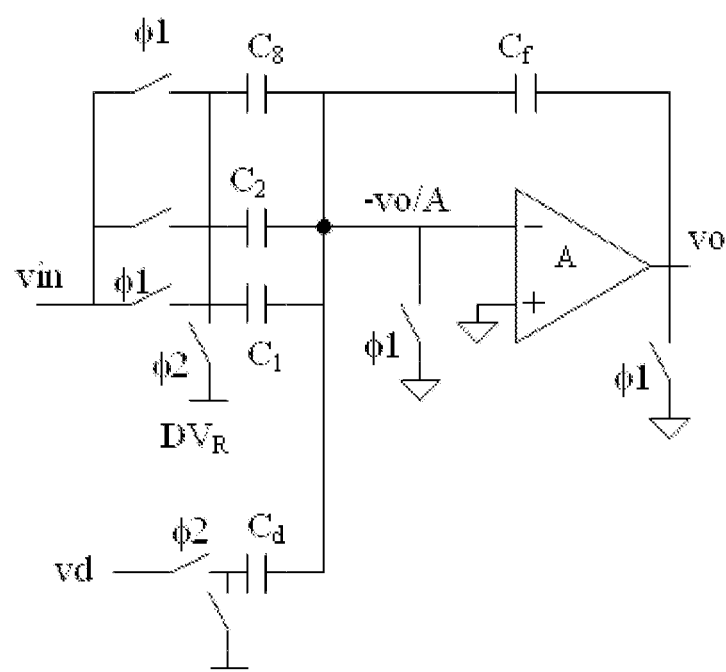
FIG. 3a shows a conventional dither injection circuit.

FIG. 3a shows an example of a conventional dither injection circuit in which dither is injected by connecting a capacitance Cd between a dither voltage Vd and the MDAC (which includes sampling capacitors C1 to C8 and an amplifier A). In the conventional injection circuit of FIG. 3a, the dither voltage Vd typically has two possible output levels: plus or minus some randomly selected voltage. When the clock signal $\phi2$ is active, the MDAC is working and Vd is connected to Cd. In the opposite phase $\phi1$, Cd is grounded and Vin is connected to the DAC capacitors.

Figure 3B:
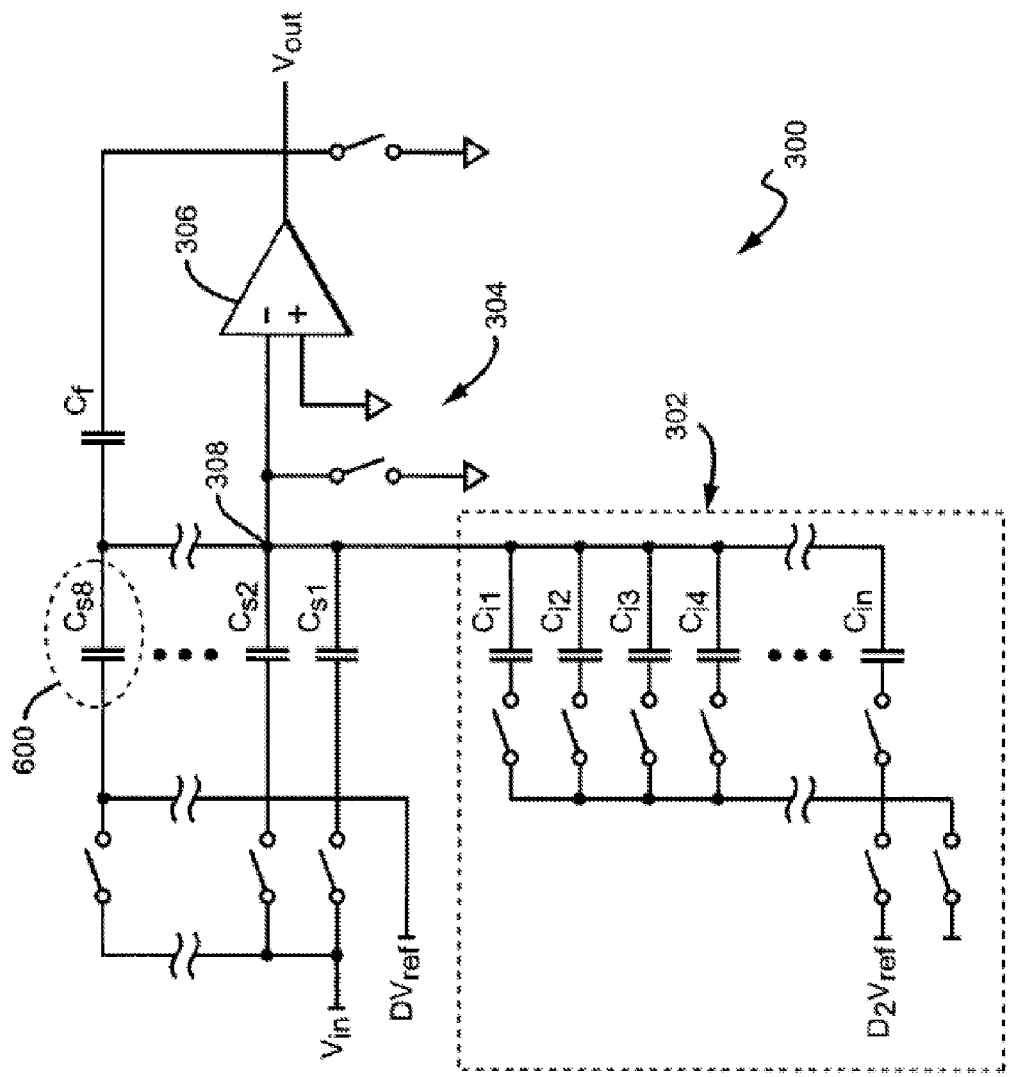
FIG. 3b shows an exemplary dither injection circuit suitable for use with a calibration method of the present invention.

An improvement to the conventional dither injection circuit of FIG. 3a is shown in FIG. 3 of the '910 patent, which is reproduced herein as FIG. 3b. The improved injection circuit differs, in part, from the circuit in FIG. 3a in that the single capacitance Cd is replaced by a plurality of smaller capacitances (each injection capacitor is smaller relative to the capacitors in the DAC component) connected in parallel. By selecting a combination of these small capacitances, different dither values can be generated as needed, ranging from a small dither value if only one of the capacitors is selected to a large dither value if all the capacitors are selected. The use of small capacitances allows the dither amplitude to be much smaller than the input signal amplitude, thereby minimizing power and dynamic range overhead problems.

Other injection circuits are also possible. For example, U.S. patent application Ser. No. 13/314,451 filed Dec. 8, 2011 ("the '451 application," the content of which is hereby incorporated by reference in its entirety) describes various dither injection circuits, including circuits for injecting dither as an analog or a digital signal into the flash component in a stage. The circuits described in the '451 application are, in principle, suitable for use with the present invention after some slight modification to support the specific injection requirements of the present invention. One possible requirement is that the dither be one of multiple discrete, equally spaced values (the significance of these values will be explained below) instead of the traditional two-level dither mentioned above. One of ordinary skill in the art would readily be able to modify the circuits described in the '451 application to support the injection of multiple dither values, and therefore the implementation details of the dither injection circuits will not be discussed further. Further, it is noted that the injection circuit in FIG. 3b is already capable of providing multiple values (levels) of dither and therefore need only be controlled in accordance with the methods of the present invention (e.g., using a suitable control circuit in the dither injection circuit 210 or in the calibration circuit 200) with little or no additional hardware required.

The calibration circuit 200 may include circuitry for processing the digital bits generated by the pipeline 105. The pipeline 105 generates bits from the different stages, and by properly combining those bits using appropriate circuitry, a digital representation can be constructed for the analog signal at any point in the pipeline. In one embodiment, the calibration circuit 200 may include connections 29 for detecting the digital output of each stage. The output from each stage may be combined, e.g., using a constructor circuit, to generate a single digital number representing the output of the pipeline, i.e., a digitized version of the analog input Vin1. In this manner, the circuit 200 may obtain both the overall output and the individual digital outputs of each stage. In an alternative embodiment, the circuitry for processing the digital bits generated by the pipeline, e.g., the constructor circuit, may be located outside the circuit 200.

The correlation circuit 220 may obtain the output of each channel and correlate the dither to the output. The correlation may be performed using any statistical correlation technique. In one embodiment, the correlation technique used is least mean squares (LMS). Applying an LMS algorithm, the correlation circuit 220 may digitally separate (de-correlate) the dither and the input Vin1 to obtain an estimate of the gain that the dither experienced after propagating through the pipeline 105. The following LMS algorithm is exemplary:

$$Ge_{n+1} = Ge_n - \mu * Vd * [Vd * Ge_n - Vs] \quad (1)$$

Ge is the estimated gain, Vd is the ideal dither, Vs is the signal (input+dither), and μ is the algorithm step-size.

Since the injected dither experiences the same amount of gain as the input Vin1, Ge represents the gain of the input. The correction circuit 230 may then correct for any gain error (deviation between Ge and an ideal gain value, which may be stored in a memory of the calibration circuit 200). The correction may be performed by adjusting the digital value of the output, which is normally obtained by applying a multiplier coefficient to the digital output of any given stage. To obtain the correction, the multiplier associated with the stage in which the dither was injected may be modified to cancel the deviation between Ge and the ideal gain value.

Dither may be injected in a plurality of stages simultaneously, so that multiple Ge values may be calculated, one for each stage in which a dither is injected. Each Ge value is representative of the gain experienced by the dither as it propagated through a respective stage and may be used for calibration of that respective stage.

As mentioned above, one of the possible injection requirements of the present invention is that the dither be one of multiple discrete equally spaced values. In one embodiment, the dither is designed to be selected from an odd (non-even) number of discrete levels that are equally spaced apart. Additionally, it is advantageous for the amplitude of the dither (for each level) to be a rational number, specifically a proper fraction of the FS value, where the denominator is an odd number M. Thus, the dither amplitude may be given by:

Dither amplitude at the output of the MDAC=k*VFS/M. M is an odd number, VFS is the full-scale voltage, and k is any number smaller than M.

Figure 6A:
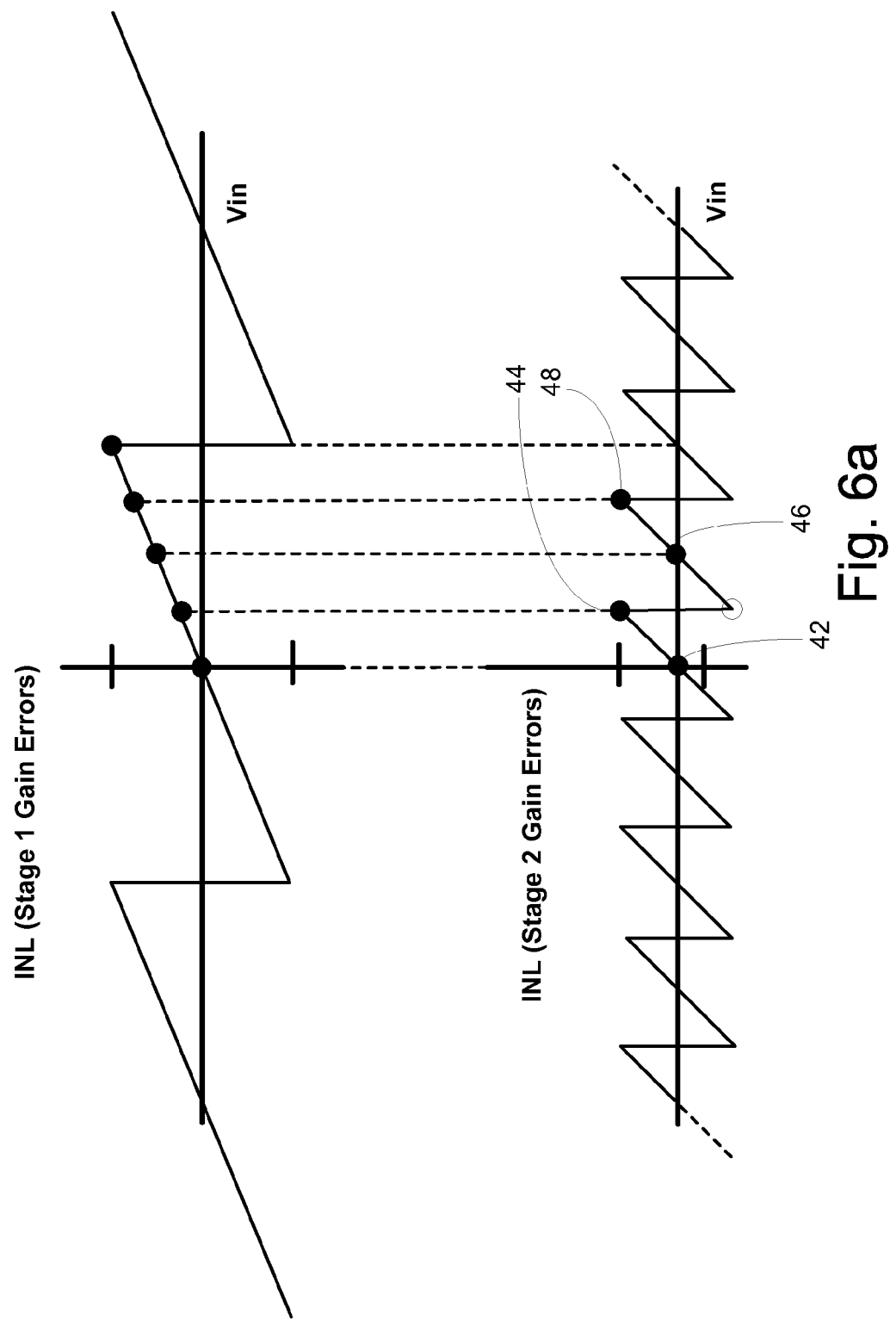
FIG. 6a shows a transfer function for inter-stage gain error in first and second stages of a pipelined ADC when the dither is selected from an even number of levels.
Figure 6B:
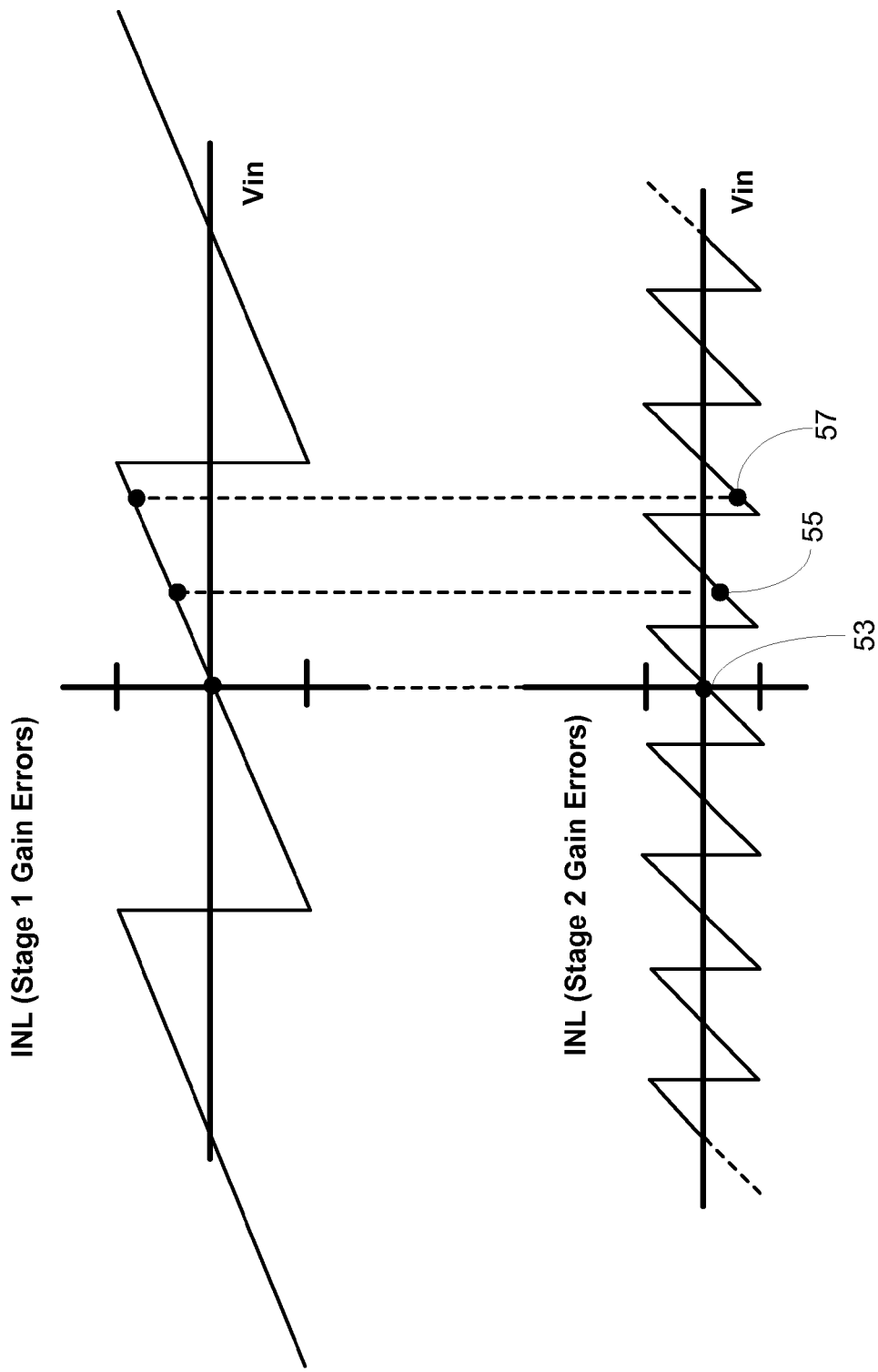
FIG. 6b shows a transfer function for inter-stage gain error in first and second stages of a pipelined ADC when the dither is selected from an odd number of levels.

In the general case, the dither can be any value selected from a range of discrete values. However, the combination of an odd number of levels and a proper fractional amplitude based on the above formula causes the injected random sequence to "dither" the linearity errors in all of the back-end stages and ensures that the dither will propagate down the pipeline and effectively dither every stage in the pipeline. This can be seen by comparing FIGS. 6a and 6b. In FIG. 6a, exemplary transfer functions for integral non-linearity (INL, which corresponds in this instance to inter-stage gain error) are shown when the dither is selected from an even (i.e., binary) number of levels. Because of the saw-tooth nature of the INL, certain input values (42, 44, 46, 48), which map to different INL values in a first stage (stage 1) end up mapping to the same INL value (42/46 and 44/48) in a subsequent stage (stage 2). In contrast, using an odd number of levels (along with a proper fractional amplitude based on an odd denominator) produces the transfer functions shown in FIG. 6b, where different input values (53, 55, 57) map to different INL values in each stage.

Referring back to FIG. 3b, the dither amplitude may be selected using appropriate combinations of capacitance values in the injection circuit. The dither amplitude at the output of the MDAC is approximately Vd*Cd/Cf, where Vd is the dither voltage, Cd is the combined capacitance of the sampling capacitors triggered by the input and Cf is the combined capacitance of the selected injection capacitors. Therefore, it is relatively straightforward to select values of Cd that produce acceptable dither amplitudes. Examples of acceptable dither amplitudes include: Dither amplitude=4/25 of MDAC-1 (first stage MDAC) output full-scale, Dither amplitude=2/23 of MDAC-1 output full-scale, etc.

In addition, the number of dither levels (and therefore the number of injection capacitors required for the dither injection circuit) can be chosen based on the improvement in accuracy needed, for example based on the following formula:

Number of additional bits of accuracy=$\log_2 N$.

The value of N is selected to compensate for the fact that the dither is smaller than the FS input signal by a factor F. Therefore, N should be chosen such that N≥F.

Figure 4:
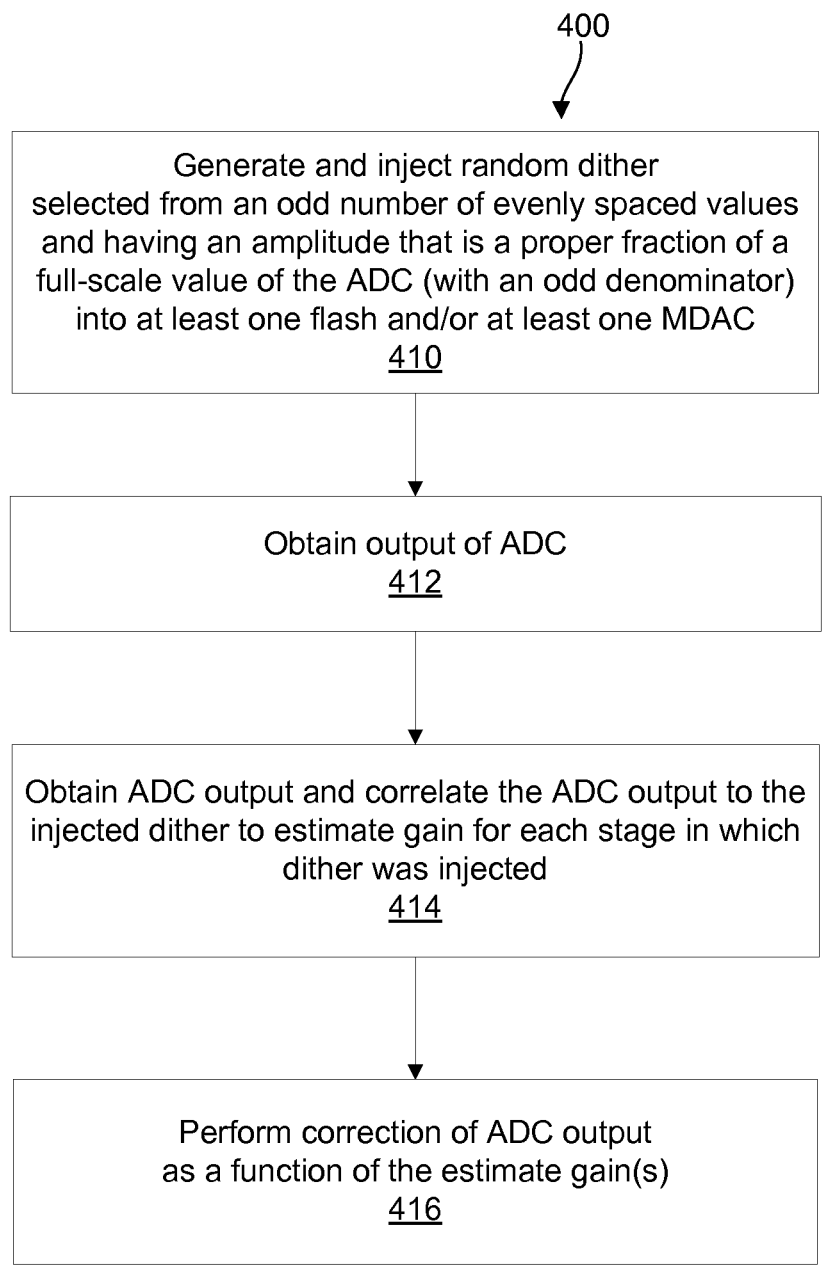
FIG. 4 shows an exemplary method for calibrating inter-stage gain error according to the present invention.

FIG. 4 is an exemplary method 400 for calibrating inter-stage gain error according to the present invention. The method 400 may begin at step 410, where the dither, which is a random or pseudo-random value, is generated and injected. As explained previously, the dither amplitude should be an proper fraction of the FS value (based on an odd denominator) and selected from an odd number of levels. The dither may be injected in a single stage (MDAC or flash, but not both) or in a plurality of stages simultaneously through an injection arrangement. For example, dither may be injected in the flash of one stage and in the MDAC of another stage at the same time.

At 412, the output of the ADC may be obtained by digitally combining the digital outputs from each stage.

At 414, dither may be separated from the ADC output using a correlation technique, such as an LMS algorithm, to estimate the gain for each stage in which dither was injected.

At 416 the ADC output is corrected as a function of the estimated gain(s) based on the deviation between the estimated gate and an ideal gain. The digital output of each stage for which a gain was estimated may be corrected, e.g., through adjustment of the multiplier associated with that stage, and the results combined to produce a corrected ADC output.

Figure 5:
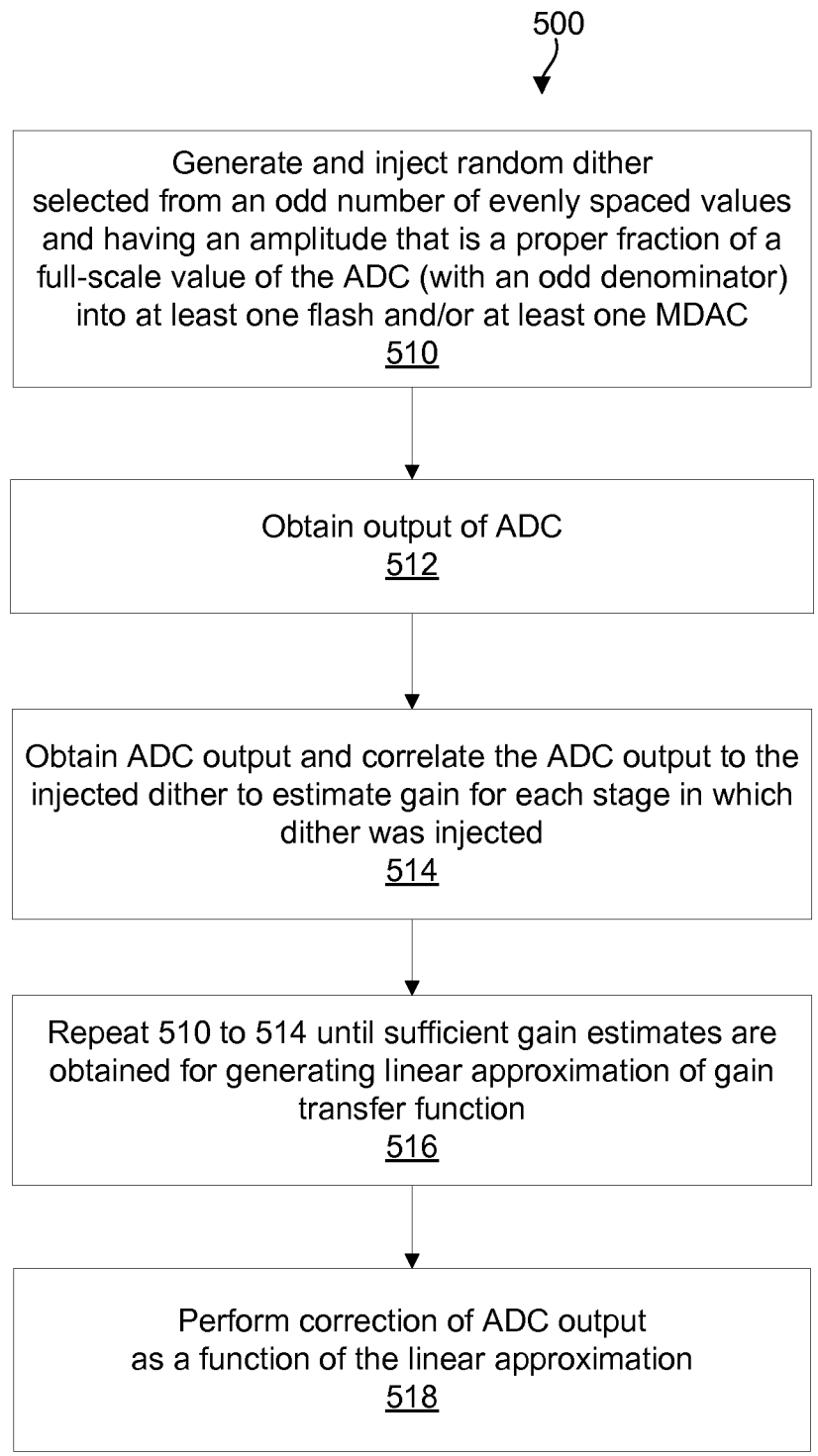
FIG. 5 shows an exemplary method for calibrating inter-stage gain non-linearity according to the present invention.

Another aspect of the present invention relates to the calibration of inter-stage gain non-linearity. FIG. 5 is an exemplary method 500 for calibrating inter-stage gain non-linearity according to the present invention. Steps 510 to 514 of the method 500 are analogous to steps 410 to 414 of the method 400 and involve the injection of dither and the estimation of gain in response to the injected dither. Steps 510 to 514 may be repeated until a sufficient number of gain estimates are obtained for generating a linear approximation of the gain transfer function of the entire ADC (516). For a coarse approximation, it may be sufficient to have as few as three data points, each data point consisting of a gain estimate-input value pair. However, for a finer approximation, additional data points may be obtained. In one embodiment, the input of the ADC may be divided into a plurality of segments and for each segment, a linear approximation of the gain transfer function is obtained using a plurality of data points. In this manner, the gain estimates that fall into different segments are processed independently to find the gain error of each segment. The linear approximations are then connected together, e.g., by the calibration circuit 200, to form a piecewise linear approximation of the entire gain transfer function.

After generating the linear approximation of the gain transfer function, the ADC output can be corrected in a similar manner as the gain error, e.g., through appropriate adjustments of the multiplier associated with the various stages so that the gain transfer function more closely approximates an ideal gain transfer function. For example, if the gain values in one particular segment are too high, then the multipliers for the stages associated with that segment may be reduced.

In addition to correcting first-order non-linearity, it is also possible, in accordance with an embodiment of the present invention, to generate a polynomial (e.g., second-order or third-order) approximation of the gain transfer function and to calibrate the ADC output based on the polynomial approximation.

Capacitance shuffling techniques may be used in conjunction with the calibration methods and circuits described above. Capacitance shuffling is described in the '910 patent in connection with the shuffling of the injection capacitors as well as the shuffling of sampling capacitors. In the case of injection capacitor shuffling, the average gain error over time equals the aggregate gain error of all the injection capacitors. In the case of sampling capacitor shuffling, the error associated with mismatches between the sampling capacitors is averaged over time. Either of these two shuffling techniques may be used in conjunction with the embodiments of the present invention. It may be especially advantageous when capacitance shuffling is used in the sampling capacitors of one or more stages that follow the earliest stage in which the dither is injected, because the multi-level dither has a limited amplitude and can only correct errors within the particular portion of the ADC input range (sub-range) covered by the dither levels. If sampling capacitor shuffling were not used in the following stages, then the gain errors caused by capacitors that are only activated in response to input signals beyond the sub-range that is covered by the dither levels would not be corrected. From a performance perspective, the use of small capacitances in conjunction with capacitance shuffling may be preferable to using a large dither injection capacitance to cover a broader sub-range. Capacitance shuffling may be controlled by the calibration circuit or a separate control circuit connected to the stages being shuffled. When both injection and sampling capacitance shuffling are used, the same control arrangement (e.g., the calibration circuit 200) may implement both types of shuffling. It may also be possible to have separate controllers each controlling one type of shuffling.

As mentioned earlier, capacitance shuffling may be applied to stages that follow the dither injection stage, i.e., following the stage being calibrated. This is different from how capacitance shuffling has traditionally been applied. Shuffling in this manner may be performed for all the following stages where the dither is still too small to cover the entire FS range. Once the dither becomes sufficiently large (e.g., compared to some pre-selected threshold amplitude), shuffling becomes less critical and shuffling may be discontinued in subsequent stages.

In another embodiment of the present invention, an additional multi-level dither signal may be injected separately from the dither being used for calibration. The additional dither may be injected into the MDAC or both the MDAC and the flash simultaneously, in conjunction with a calibration dither and could be used to reduce the effect of the back-end non-idealities on the digitizing of the calibration dither signal. Therefore, although the additional dither is not directly used for calibration, it operates to improve the effectiveness of the calibration dither signal by dithering the non-idealities of the stage into which the additional dither is injected and all subsequent stages. The previously mentioned requirements on the multi-level dither used for calibration would also apply to this additional dither (e.g., an odd number of evenly spaced levels). As with the calibration dither, the additional dither must be separated out in order to form the final ADC output. Since the additional dither is not used for calibration, it does not need to be correlated out and can be directly subtracted from the digital output of the stage into which it is injected.

If the additional dither is injected in both the MDAC and flash of any one stage, then it does not consume any portion of the correction range, and therefore the additional dither can be made large in amplitude without interfering with normal ADC operation. Ideally, it can be as large as $+/-\frac{1}{2}$ of the stage sub-range. This would improve the effectiveness of the calibration dither, and may also reduce the need for capacitance shuffling in the following stage(s), because the large additional dither would already cover the entire full-scale range even before shuffling. Therefore, the additional dither is preferably injected into the earliest stage that is being calibrated, i.e., the earliest stage in which a calibration dither is injected.

Instead of injecting the additional dither into a stage that is being calibrated, the additional dither may be injected into a previous stage. The additional dither may, in fact, be a calibration dither from the previous stage. That is, the additional dither may not be an additional dither signal from the perspective of the previous stage. For example, a multi-level dither can be used for calibrating stage 1 as well as for dithering the non-idealities of stage 1 and all subsequent stages (stage 2, stage 3 . . . etc.). Any multi-level dither that meets the previously described requirements and is injected into the first stage will operate to dither the non-idealities of all the backend stages (the first stage all the way through the last stage), regardless of whether the multi-level dither is used for calibration.

When the additional dither is used (e.g., for calibration or for dithering the non-idealities), calibration of subsequent stages can be done using a conventional two-level dither signal. In the example where multi-level dither is used for calibrating stage 1, two-level dither can be used for calibrating stage 2, stage 3, etc., since it may be sufficient to inject multi-level dither in stage 1. Therefore, while the above described embodiments refer to the use of multi-level dither for calibration purposes, multi-level dither need not be exclusively used for all calibrations in the ADC. In fact, multi-level dither need not be used for any calibration as long as a multi-level dither is injected for other purposes. For example, stages 1, 2 and 3 can be calibrated using two-level dither if a multi-level dither is injected into stage 1 (e.g., a large multi-level dither injected simultaneously in the MDAC and flash of stage 1) for the purpose of dithering the non-idealities of all the backend stages.

In the preceding specification, the present invention has been described with reference to specific example embodiments thereof. It will, however, be evident that various modifications and changes may be made thereunto without departing from the broader spirit and scope of the present invention as set forth in the claims that follow. The embodiments described herein may be presented combined with each other in various combinations. The specification and drawings are accordingly to be regarded in an illustrative rather than restrictive sense.

What is claimed is:

1. A method for calibrating a pipelined analog-to-digital converter (ADC), comprising:
    injecting a randomly determined amount of dither into one of a flash component and a multiplying digital-to-analog converter (MDAC) in at least one stage in the ADC; and
    for each stage of the at least one stage:
        performing a correlation procedure to estimate, based on an output of the ADC, an amount of gain experienced by the injected dither after propagating through the stage; and
        calibrating the stage based on its respective gain estimate.

2. The method of claim 1, wherein the calibrating corrects for a deviation between the gain estimate and an ideal gain value.

3. The method of claim 1, wherein the dither is selected from a predefined range of discrete values.

4. The method of claim 3, wherein the range of discrete values has an odd number of values that are equally spaced apart.

5. The method of claim 4, wherein the dither is smaller than a full-scale value of the ADC by a factor F and the number of discrete values is determined as a function of F.

6. The method of claim 1, wherein an amplitude of the dither is a proper fraction of a full-scale value of the ADC, and the denominator of the proper fraction is an odd number.

7. The method of claim 6, wherein the proper fraction is equal to k*VFS/M, where M is the odd number, VFS is the full-scale value, and k is smaller than M.

8. The method of claim 1, further comprising:
applying a capacitance shuffling scheme to a set of capacitors that generate the dither.

9. The method of claim 1, further comprising:
applying a capacitance shuffling scheme to a set of sampling capacitors in at least one additional stage that follows the at least one stage in the pipeline.

10. The method of claim 1, wherein the dither is injected into fewer than all the stages in the pipeline, and at least into a stage nearest an input of the ADC.

11. The method of claim 1, further comprising:
generating, based on a plurality of gain estimates, an approximation of a gain transfer function of the ADC; and
calibrating each stage of the at least one stage based on the approximation of the gain transfer function.

12. The method of claim 11, wherein the approximation is a piecewise linear approximation.

13. The method of claim 11, wherein the approximation is a polynomial approximation.

14. The method of claim 1, further comprising:
injecting an additional randomly determined amount of dither into at least one of an MDAC and a flash component, in one of a selected stage in the at least one stage and a stage that precedes an earliest stage of the at least one stage, wherein the additional dither is selected from a predefined range of discrete values; and
taking the additional dither into account when forming a final ADC output.

15. The method of claim 1, further comprising:
selecting the dither from a predefined range of discrete values, the range of discrete values having an odd number of values that are equally spaced apart; and
selecting an amplitude of the dither to be a proper fraction of a full-scale value of the ADC, wherein the denominator of the proper fraction is an odd number.

16. The method of claim 1, further comprising:
selecting an amplitude of the dither that causes the dither to propagate down the pipeline and dither all subsequent stages in the pipeline.

17. A device for calibrating a pipelined analog-to-digital converter (ADC), comprising:
an injection arrangement that injects a randomly determined amount of dither into one of a flash component and a multiplying digital-to-analog converter (MDAC) in at least one stage in the ADC; and
a calibration arrangement that, for each stage of the at least one stage:
performs a correlation procedure to estimate, based on an output of the ADC, an amount of gain experienced by the injected dither after propagating through the stage; and
calibrates the stage based on its respective gain estimate.

18. The device of claim 17, wherein the calibrating corrects for a deviation between the gain estimate and an ideal gain value.

19. The device of claim 17, wherein the dither is selected from a predefined range of discrete values.

20. The device of claim 19, wherein the range of discrete values has an odd number of values that are equally spaced apart.

21. The device of claim 20, wherein the dither is smaller than a full-scale value of the ADC by a factor F and the number of discrete values is determined as a function of F.

22. The device of claim 17, wherein an amplitude of the dither is a proper fraction of a full-scale value of the ADC, and the denominator of the proper fraction is an odd number.

23. The device of claim 22, wherein the proper fraction is equal to k*VFS/M, where M is the odd number, VFS is the full-scale value, and k is smaller than M.

24. The device of claim 17, further comprising:
a control arrangement that applies a capacitance shuffling scheme to a set of capacitors that generate the dither.

25. The device of claim 17, further comprising:
a control arrangement that applies a capacitance shuffling scheme to a set of sampling capacitors in at least one additional stage that follows the at least one stage in the pipeline.

26. The device of claim 17, wherein the dither is injected into fewer than all the stages in the pipeline, and at least into a stage nearest an input of the ADC.

27. The device of claim 17, wherein the calibration arrangement:
generates, based on a plurality of gain estimates, an approximation of a gain transfer function of the ADC; and
calibrates each stage of the at least one stage based on the approximation of the gain transfer function.

28. The device of claim 27, wherein the approximation is a piecewise linear approximation.

29. The device of claim 27, wherein the approximation is a polynomial approximation.

30. The device of claim 17, wherein:
the injection arrangement injects an additional randomly determined amount of dither into at least one of an MDAC and a flash component, in one of a selected stage in the at least one stage and a stage that precedes an earliest stage of the at least one stage, wherein the additional dither is selected from a predefined range of discrete values; and
the calibration arrangement takes the additional dither into account when forming a final ADC output.

31. The device of claim 17, wherein the injection arrangement:
selects the dither from a predefined range of discrete values, the range of discrete values having an odd number of values that are equally spaced apart; and
selects an amplitude of the dither to be a proper fraction of a full-scale value of the ADC, where the denominator of the proper fraction is an odd number.

32. The device of claim 17, wherein the injection arrangement selects an amplitude of the dither that causes the dither to propagate down the pipeline and dither all subsequent stages in the pipeline.

* * * * *